(12) United States Patent
Tao et al.

(10) Patent No.: US 7,141,867 B2
(45) Date of Patent: Nov. 28, 2006

(54) QUAD FLAT NON-LEADED PACKAGE

(75) Inventors: Su Tao, Kaohsiung (TW); Chi-Wen Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/170,309

(22) Filed: Jun. 29, 2005

(65) Prior Publication Data
US 2006/0001136 A1 Jan. 5, 2006

(30) Foreign Application Priority Data
Jun. 30, 2004 (TW) .............................. 93119666 A

(51) Int. Cl.
*H01L 23/495* (2006.01)
(52) U.S. Cl. ...................... 257/666; 257/676
(58) Field of Classification Search ................ 257/666, 257/676, 784, 787; 438/123–124
See application file for complete search history.

(56) References Cited

U.S. PATENT DOCUMENTS

| | | | |
|---|---|---|---|
| 5,942,794 A | 8/1999 | Okumura et al. | |
| 6,075,284 A | 6/2000 | Choi et al. | |
| 6,198,171 B1 | 3/2001 | Huang et al. | |
| 6,281,568 B1 * | 8/2001 | Glenn et al. | 257/684 |
| 6,559,525 B1 * | 5/2003 | Huang | 257/675 |

* cited by examiner

*Primary Examiner*—Theresa T. Doan
(74) *Attorney, Agent, or Firm*—Ladas & Parry

(57) ABSTRACT

The present invention relates to a quad flat non-leaded package comprising: a lead frame, a semiconductor chip, a plurality of connecting wires and a molding compound. The lead frame has a plurality of leads, a die pad, a plurality of supporting bars and an external ring. The external ring is disposed around the die pad and is in contact with the semiconductor chip so as to increase the supporting to the semiconductor chip. The area of the semiconductor chip is larger than that of the die pad, and the semiconductor chip is attached to the die pad through its active surface. The molding compound encapsulates the lead frame, semiconductor chip and connecting wires, wherein part of the leads of the lead frame is exposed to the outside of the molding compound so as to be electrically connected to an external device.

15 Claims, 4 Drawing Sheets

QUAD FLAT NON-LEADED PACKAGE

BACKGROUND OF THE INVENTION

1. Field of the Invention

The present invention relates to a semiconductor package, and more particularly, to a quad flat non-leaded package.

2. Description of the Related Art

FIG. 1 shows a cross sectional view of a conventional quad flat non-leaded package. The conventional quad flat non-leaded package 10 comprises a lead frame 11, a semiconductor chip 12, a plurality of bonding wires 13 and a molding compound 14.

The lead frame 11 has a plurality of leads 111, a die pad 112 and a plurality of supporting bars (not shown). The die pad 112 has a top surface 1121 and a bottom surface 1122 being opposite to the top surface 1121. The supporting bars are used for supporting the die pad 112. The leads 111 are disposed at the periphery of the die pad 112. In order to facilitate wire bonding, prevent introduction of moisture into the molded package and enhance the engagement between the leads 111 and the molding compound 14, each of the leads 111 is designed to be in a stepped configuration. Thus, each of the leads 111 comprises a top surface 1111, a bottom surface 1112 and a relative thin bonding area 1113, wherein the bottom surface 1112 of the leads 111 and the bottom surface 1122 of the die pad 112 are on the same plane, and the top surfaces 1111 of the leads 111 and the top surfaces of the die pads 112 and the supporting bars are on the same plane. The bonding area 1113 is used for wire bonding by the bonding wire 13.

The semiconductor chip 12 has an active surface 121 and a back surface 122 being opposite to the active surface 121, wherein the active surface 121 has a plurality of bonding pads 123 thereon. The area of the semiconductor chip 12 is larger than that of the die pad 112 and therefore, after the active surface 121 is attached onto the top surface 1121 of the die pad 112 by utilizing an adhesive material 15 with high thermal conductivity, the bonding pads 123 are exposed.

The bonding wires 13, for example, gold wires or aluminum, are used for electrically coupling the bonding pads 123 to the bonding areas 1113 of the leads 111.

The molding compound 14 encapsulates the lead frame 11, the semiconductor chip 12 and the bonding wires 13, wherein the bottom surfaces 1112 and side surfaces of the leads 111 of the lead frame 11 are exposed to the outside of the molding compound 14 so as to be electrically connected to an external device. Additionally, the bottom surface 1122 of the die pad 112 is also exposed to the outside of the molding compound 14 so as to increase heat-dissipating efficiency.

A shortcoming of the conventional quad flat non-leaded package 10 is that when the semiconductor chip 12 becomes larger, the supporting area of the die pad 112 to the semiconductor chip 12 is not large enough to support the semiconductor chip 12. Therefore, the circumference of the active surface 121 of the semiconductor chip 12 is suspended. As a result, the semiconductor chip 12 may break or shift during wire bonding procedure, which causes packaging failure.

Consequently, there is an existing need for a novel and improved quad flat non-leaded package to solve the above-mentioned problem.

SUMMARY OF THE INVENTION

One objective of the present invention is to add an external ring in the quad flat non-leaded package, wherein the external ring is disposed around the die pad and supports the circumference of the semiconductor chip so as to enhance the supporting to the semiconductor chip. Furthermore, the external ring can be an additional heat-dissipating path, which can increase the heat-dissipating efficiency of the entire package.

Another objective of the present invention is to provide a quad flat non-leaded package comprising: a lead frame, a semiconductor chip, a plurality of bonding wires and a molding compound.

The lead frame has a plurality of leads, a die pad, a plurality of supporting bars and an external ring. The leads are disposed at the periphery of the die pad. The die pad has a top surface and a bottom surface being opposite to the top surface. The supporting bars are used for supporting the die pad. The external ring is disposed around the die pad and is connected to the supporting bars, wherein there is a gap between the external ring and the die pad.

The semiconductor chip having an active surface and a back surface being opposite to the active surface, wherein the active surface has a plurality of bonding pads thereon. The area of the semiconductor chip is larger than that of the die pad. The active surface is attached onto the top surfaces of the die pad and the external ring, and the bonding pads are exposed via the gap between the external ring and the die pad.

The bonding wires are used for electrically coupling the bonding pads to the leads, and the bonding pads to the external ring, respectively.

The molding compound is used for encapsulating the lead frame, the semiconductor chip and the bonding wires, wherein parts of the leads of the lead frame are exposed to the outside of the molding compound.

DETAILED DESCRIPTION OF THE INVENTION

Figure 1:
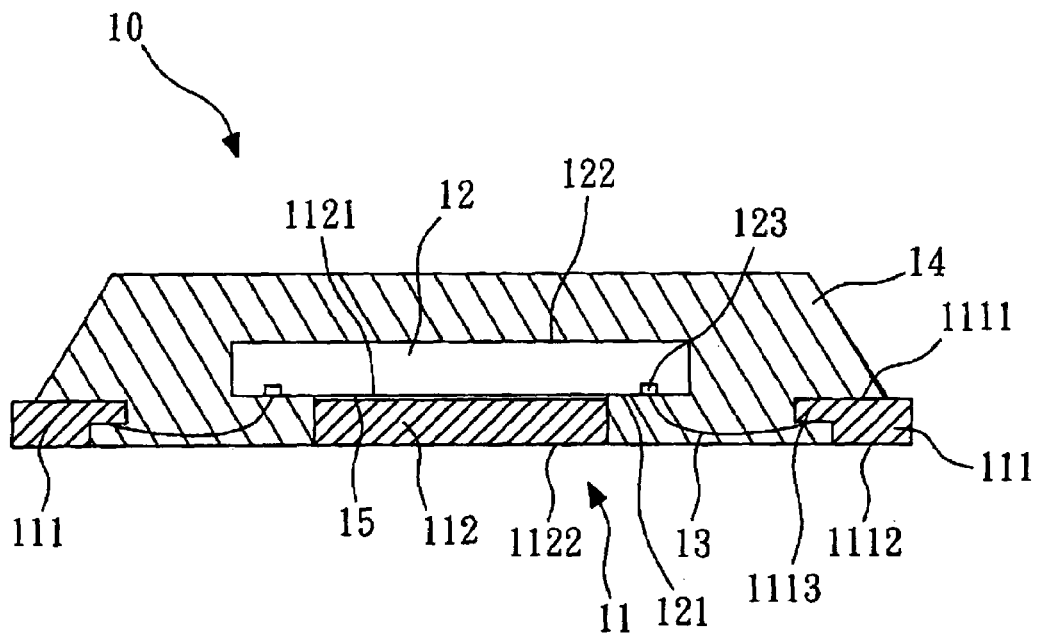
FIG. 1 shows a cross sectional view of a conventional quad flat non-leaded package.
Figure 2:
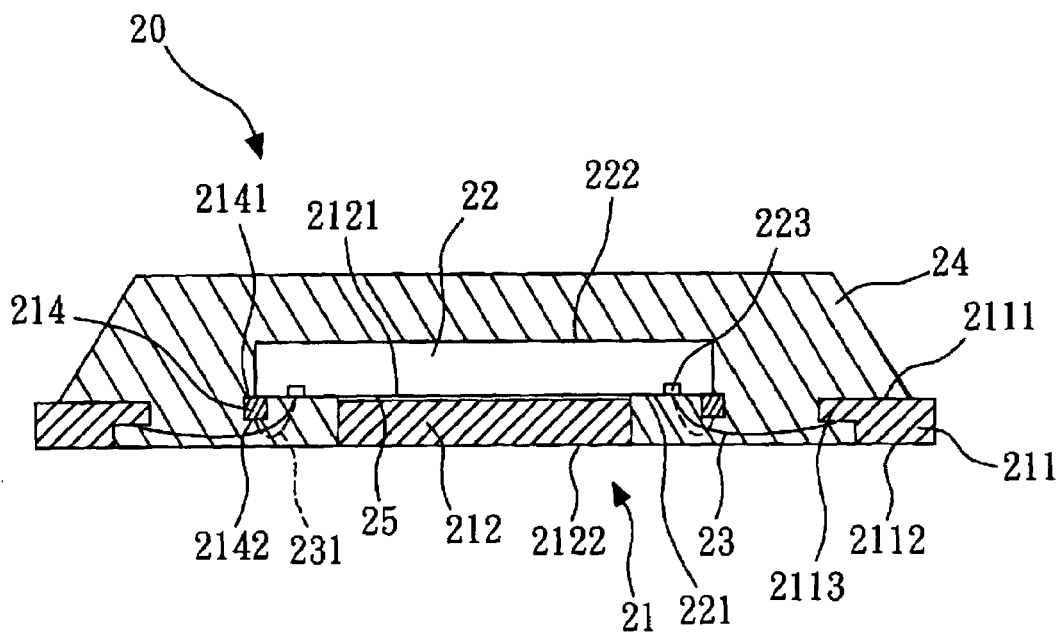
FIG. 2 shows a cross sectional view of a quad flat non-leaded package according to the first embodiment of the present invention.
Figure 3:
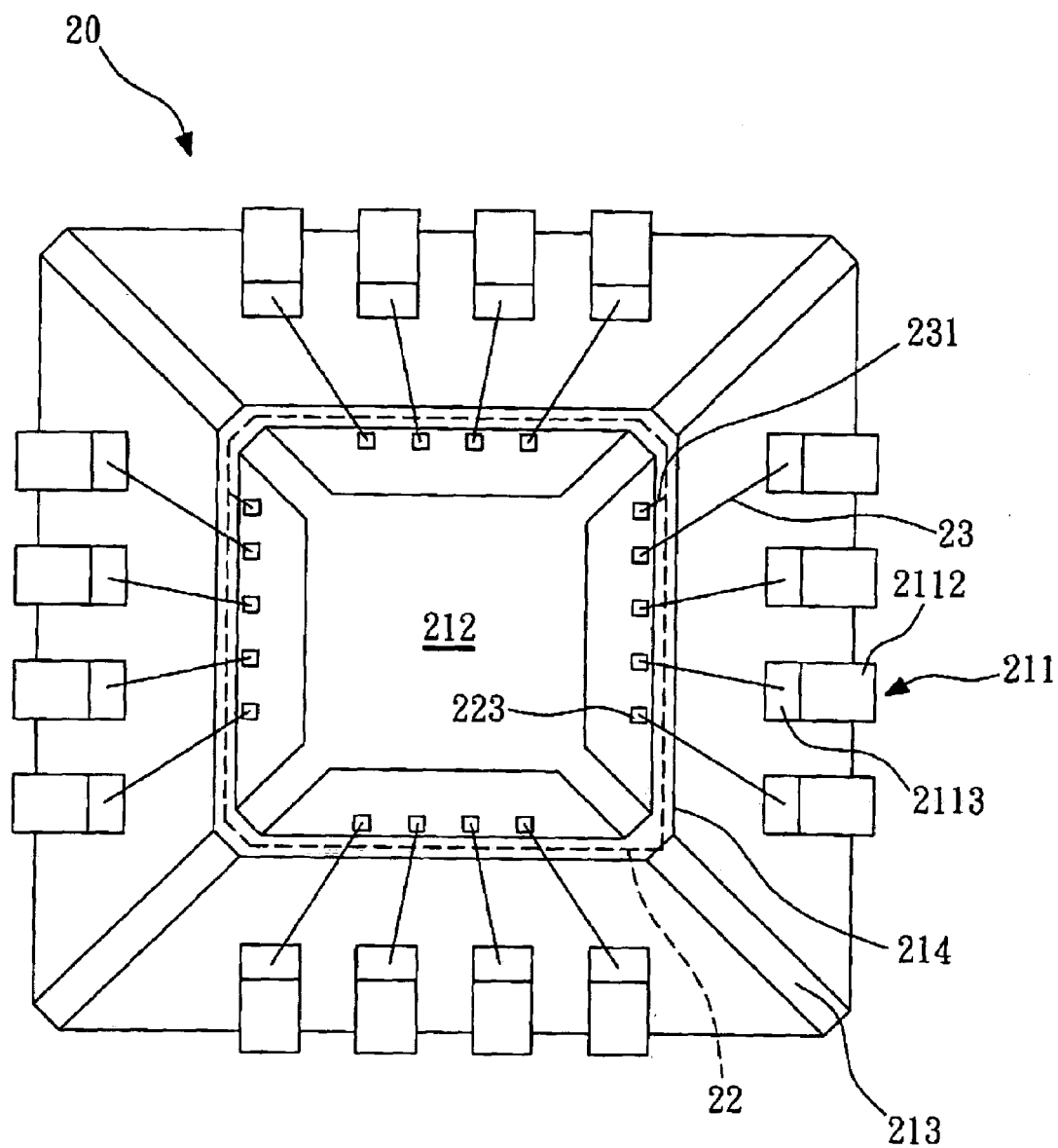
FIG. 3 shows a bottom view of a quad flat non-leaded package according to the first embodiment of the present invention.

FIGS. 2 and 3 show the cross sectional view and the top view of a quad flat non-leaded package according to the first embodiment of the present invention, respectively, wherein the molding compound is omitted in FIG. 3. The quad flat non-leaded package 20 comprises a lead frame 21, a semiconductor chip 22, a plurality of bonding wires 23, 231, and a molding compound 24.

The lead frame 21 has a plurality of leads 211, a die pad 212, a plurality of supporting bars 213 and an external ring 214. The die pad 212 has a top surface 2121 and a bottom surface 2122 being opposite to the top surface 2121. The supporting bars 213 are used for connecting and supporting the die pad 212. The leads 211 are disposed at the periphery of the die pad 212. In order to facilitate wire bonding, prevent introduction of moisture into the molded package and enhance the engagement between the leads 211 and the molding compound 24, each of the leads 211 is designed to be in a stepped configuration. Thus, each of the leads 211 comprises a top surface 2111, a bottom surface 2112 and a relative thin bonding area 2113, wherein the bottom surface 2112 of the leads 211 and the bottom surface 2122 of the die pad 212 are on the same plane. The bonding area 2113 is used for wire bonding by the bonding wire 23.

The external ring 214 is disposed around the die pad 212 and is connected to the supporting bars 213, wherein there is a gap between the external ring 214 and the die pad 212. In operation, the external ring 214 may be a ground ring or a power ring, which has a top surface 2141 and a bottom surface 2142 being opposite to the top surface 2141. Preferably, the top surface 2141 of the external ring 214, the top surface 2111 of the lead 211, the top surface 2121 of the die pad 212 and the top surface of the supporting bar 213 are on the same plane. The bottom surface 2142 of the external ring 214 is used for wire bonding by the bonding wire 231.

The semiconductor chip 22 has an active surface 221 and a back surface 222 being opposite to the active surface 221, wherein the active surface 221 has a plurality of bonding pads 223 thereon. The area of the semiconductor chip 22 is larger than that of the die pad 212, therefore, after the active surface 221 is attached onto the top surface 2121 of the die pad 212 by utilizing an adhesive material 25 with high thermal conductivity, the bonding pads 223 are exposed via the gap between the external ring 214 and the die pad 212. In this embodiment, the top surface 2141 of the external ring 214 is in contact with the circumference of the active surface 221 of the semiconductor chip 22 so as to enhance the supporting to the semiconductor chip 22.

The bonding wires 23, 231, for example, gold wires or aluminum, are used for electrically coupling the bonding pads 223 to the bonding area 2113 of the leads 211 (for example, by bonding wires 23), and the bonding pads 223 to the bottom surface 2142 of the external ring 214 (for example, by bonding wires 231), respectively.

The molding compound 24 encapsulates the lead frame 21, the semiconductor chip 22 and the bonding wires 23, 231, wherein the bottom surfaces 2112 and side surfaces of the leads 211 of the lead frame 21 are exposed to the outside of the molding compound 24 so as to be electrically connected to an external device. Additionally, the bottom surface 2122 of the die pad 212 is also exposed to the outside of the molding compound 24 so as to increase heat-dissipating efficiency.

Figure 4:
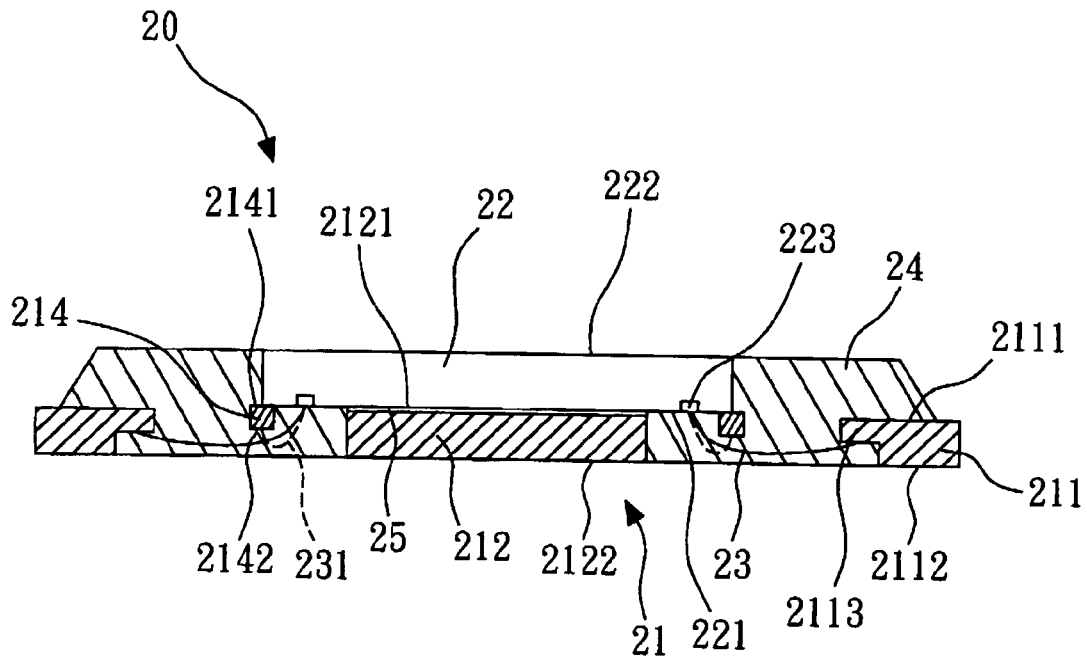
FIG. 4 shows a cross sectional view of a quad flat non-leaded package according to the second embodiment of the present invention.

FIG. 4 shows a cross sectional view of a quad flat non-leaded package according to the second embodiment of the present invention. The package structure of this embodiment is substantially the same as that of the first embodiment except that the back surface 22 of the semiconductor chip 22 in this embodiment is exposed to the outside of the molding compound 24 so as to increase heat-dissipating efficiency.

Figure 5:
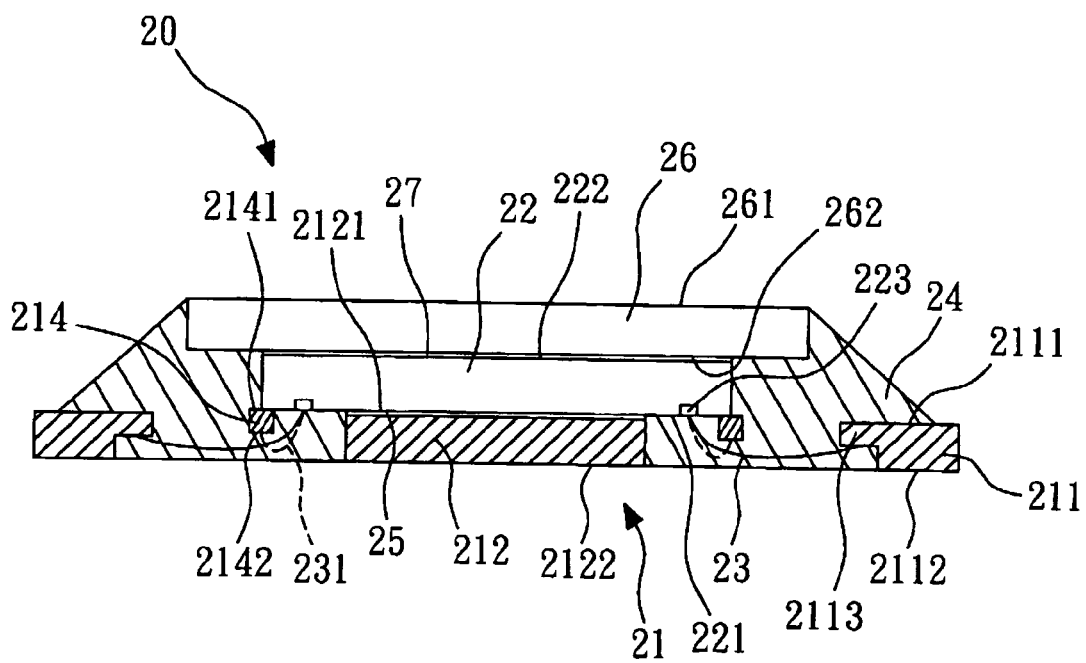
FIG. 5 shows a cross sectional view of a quad flat non-leaded package according to the third embodiment of the present invention.

FIG. 5 shows a cross sectional view of a quad flat non-leaded package according to the third embodiment of the present invention. The package structure of this embodiment is substantially the same as that of the first embodiment except adding a heat spreader 26. The heat spreader 26 has a top surface 261 and a bottom surface 262 being opposite to the top surface 261, wherein the bottom surface 262 of the heat spreader 26 is attached onto the back surface 222 of the semiconductor chip 22 by utilizing an adhesive material 27 with high thermal conductivity. It should be understood that the top surface 261 of the heat spreader 26 may be exposed to the outside of the molding compound 24 so as to increase heat-dissipating efficiency.

Figure 6:
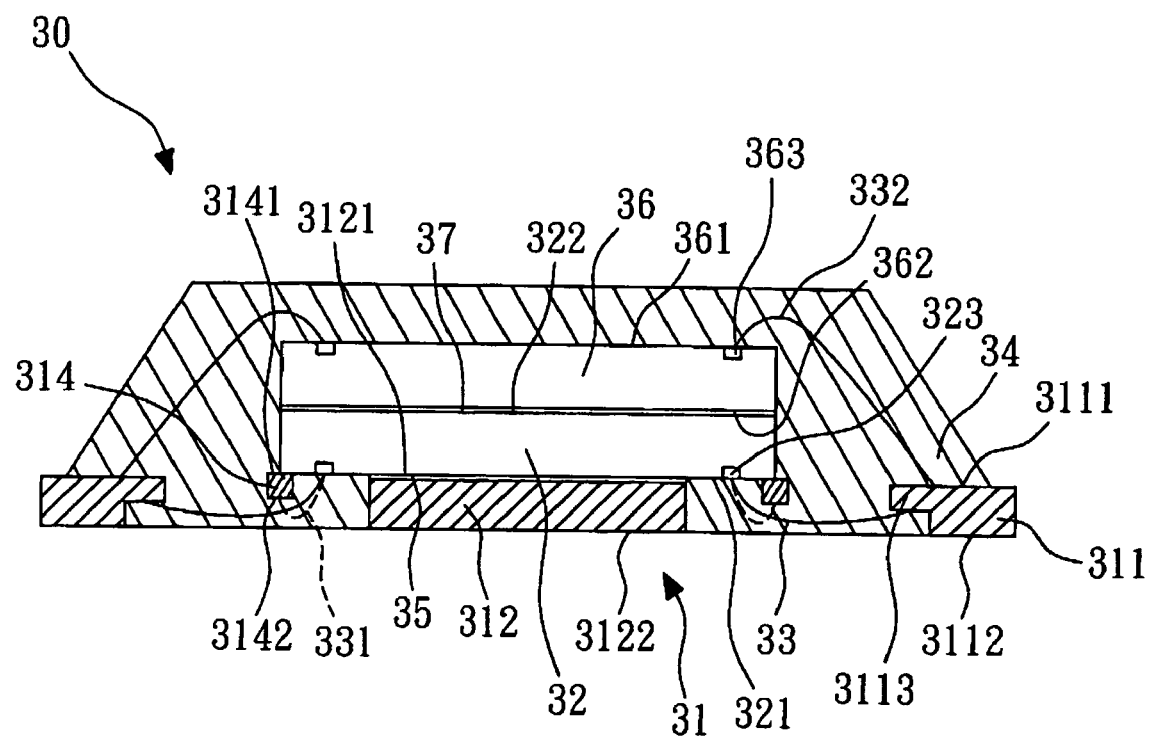
FIG. 6 shows a cross sectional view of a quad flat non-leaded package according to the fourth embodiment of the present invention.

FIG. 6 shows a cross sectional view of a quad flat non-leaded package according to the fourth embodiment of the present invention. The quad flat non-leaded package 30 is a stacked chip package that comprises a lead frame 31, a first semiconductor chip 32, a second semiconductor chip 36, a plurality of bonding wires 33, 331, 332 and a molding compound 34.

The lead frame 31 has a plurality of leads 311, a die pad 312, a plurality of supporting bars (not shown) and an external ring 314. The die pad 312 has a top surface 3121 and a bottom surface 3122 being opposite to the top surface 3121. The supporting bars are used for connecting and supporting the die pad 312. The leads 311 are disposed at the periphery of the die pad 312, and each of the leads 311 is designed to be in a stepped configuration and comprises a top surface 3111, a bottom surface 3112 and a relative thin bonding area 3113, wherein the bottom surface 3112 of the leads 311 and the bottom surface 3122 of the die pad 312 are on the same plane. The bonding area 3113 is used for wire bonding by the bonding wire 33. The top surface 3111 is used for wire bonding by the bonding wire 332.

The external ring 314 is disposed around the die pad 312 and is connected to the supporting bars, wherein there is a gap between the external ring 314 and the die pad 312. In operation, the external ring 314 may be a ground ring or a power ring, which has a top surface 3141 and a bottom surface 3142 being opposite to the top surface 3141. Preferably, the top surface 3141 of the external ring 314, the top surface 3111 of the lead 311, the top surface 3121 of the die pad 312 and the top surface of the supporting bar are on the same plane. The bottom surface 3142 of the external ring 314 is used for wire bonding by the bonding wire 331.

The first semiconductor chip 32 has a first active surface 321 and a second back surface 322 being opposite to the first active surface 321, wherein the first active surface 321 has a plurality of first bonding pads 323 thereon. The area of the first semiconductor chip 32 is larger than that of the die pad 312, therefore, after the first active surface 321 is attached onto the top surface 3121 of the die pad 312 by utilizing an adhesive material 35 with high thermal conductivity, the first bonding pads 323 are exposed via the gap between the external ring 314 and the die pad 312. In this embodiment, the top surface 3141 of the external ring 314 is in contact with the circumference of the first active surface 321 of the first semiconductor chip 32 so as to enhance the supporting to the first semiconductor chip 32.

The second semiconductor chip 36 has a second active surface 361 and a second back surface 362 being opposite to the second active surface 361, wherein the second active surface 361 has a plurality of second bonding pads 363 thereon. The second back surface 362 of the second semiconductor chip 36 is attached onto the first back surface 322 of the first semiconductor chip 32 by utilizing an adhesive material 37 with high thermal conductivity.

The bonding wires 33, 331, 332 are used for electrically coupling the first bonding pads 323 to the bonding area 3113 of the leads 311 (for example, by bonding wire 33), the second bonding pads 363 to the top surface 3111 of the leads (for example, by bonding wire 332), and the first bonding pads 323 to the bottom surface 3142 of the external ring 314 (for example, by bonding wire 331), respectively.

The molding compound 34 encapsulates the lead frame 31, the first semiconductor chip 32, the second semiconductor chip 36 and the bonding wires 33, 331, 332, wherein the bottom surface 3112 and side surface of the lead 311 of the lead frame 31 are exposed to the outside of the molding compound 34 so as to be electrically connected to an external device. Additionally, the bottom surface 3122 of the die pad 312 is also exposed to the outside of the molding compound 34 so as to increase heat-dissipating efficiency.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A quad flat non-leaded package comprising:
   a lead frame having a plurality of leads, a die pad, a plurality of supporting bars and an external ring, wherein the leads are disposed at the periphery of the die pad, the die pad has a top surface and a bottom surface being opposite to the top surface, the supporting bars are used for supporting the die pad, the external ring is disposed around the die pad and is connected to the supporting bars, wherein there is a gap between the external ring and the die pad;
   a semiconductor chip having an active surface and a back surface being opposite to the active surface, wherein the active surface has a plurality of bonding pads thereon, the area of the semiconductor chip is larger than that of the die pad, the active surface is attached onto the top surfaces of the die pad and the external ring, and the bonding pads are exposed via the gap between the external ring and the die pad;
   a plurality of bonding wires for electrically coupling the bonding pads to the leads, and the bonding pads to the external ring, respectively; and
   a molding compound encapsulating the lead frame, the semiconductor chip and the bonding wires, wherein parts of the leads of the lead frame are exposed to the outside of the molding compound.

2. The quad flat non-leaded package according to claim 1, wherein the external ring is a ground ring.

3. The quad flat non-leaded package according to claim 1, wherein the external ring is a power ring.

4. The quad flat non-leaded package according to claim 1, wherein the top surfaces of the leads, the die pad, the supporting bars and the external ring are on the same plane.

5. The quad flat non-leaded package according to claim 1, wherein each of the leads is in a stepped configuration and comprises a top surface, a bottom surface and a relative thin bonding area, wherein the bottom surfaces of the leads and the die pad are on the same plane, the bonding area is electrically connected to the bonding pad through the bonding wire.

6. The quad flat non-leaded package according to claim 5, wherein the bottom surfaces of the leads and the die pad are exposed to the outside of the molding compound.

7. The quad flat non-leaded package according to claim 1, wherein the back surface of the semiconductor chip is exposed to the outside of the molding compound.

8. The quad flat non-leaded package according to claim 1, wherein the external ring is in contact with the circumference of the active surface of the semiconductor chip.

9. The quad flat non-leaded package according to claim 1, further comprising a heat spreader having a top surface and a bottom surface being opposite to the top surface, wherein the bottom surface of the heat spreader is in contact with the back surface of the semiconductor, and the top surface of the heat spreader is exposed to the outside of the molding compound.

10. A quad flat non-leaded package comprising:
    a lead frame having a plurality of leads, a die pad, a plurality of supporting bars and an external ring, wherein the leads are disposed at the periphery of the die pad, the die pad has a top surface and a bottom surface being opposite to the top surface, the supporting bars are used for supporting the die pad, the external ring is disposed around the die pad and is connected to the supporting bars, wherein there is a gap between the external ring and the die pad;
    a first semiconductor chip having a first active surface and a first back surface being opposite to the first active surface, wherein the first active surface has a plurality of first bonding pads thereon, the area of the first semiconductor chip is larger than that of the die pad, the first active surface is attached onto the top surfaces of the die pad and the external ring, and the first bonding pads are exposed via the gap between the external ring and the die pad;
    a second semiconductor chip having a second active surface and a second back surface being opposite to the second active surface, wherein the second active surface has a plurality of second bonding pads thereon, the second back surface of the second semiconductor chip is attached onto the first back surface of the first semiconductor chip;
    a plurality of bonding wires for electrically coupling the first bonding pads to the leads, the second bonding pads to the leads, and the first bonding pads to the external ring, respectively; and
    a molding compound encapsulating the lead frame, the first semiconductor chip, the second semiconductor chip and the bonding wires, wherein parts of the leads of the lead frame are exposed to the outside of the molding compound.

11. The quad flat non-leaded package according to claim 10, wherein the external ring is a ground ring.

12. The quad flat non-leaded package according to claim 10, wherein the external ring is a power ring.

13. The quad flat non-leaded package according to claim 10, wherein each of the leads is in a stepped configuration and comprises a top surface, a bottom surface and a relative thin bonding area, wherein the bottom surfaces of the leads and the die pad are on the same plane, the bonding area is electrically connected to the first bonding pad through the bonding wire, the top surface of the lead is electrically connected to the second bonding pad through the bonding wire.

14. The quad flat non-leaded package according to claim 13, wherein the bottom surfaces of the leads and the die pad are exposed to the outside of the molding compound.

15. The quad flat non-leaded package according to claim 10, wherein the external ring is in contact with the circumference of the first active surface of the first semiconductor chip.

\* \* \* \* \*